(12) United States Patent
Yang et al.

(10) Patent No.: US 11,510,342 B1
(45) Date of Patent: Nov. 22, 2022

(54) IMMERSION HEAT DISSIPATION STRUCTURE

(71) Applicant: AMULAIRE THERMAL TECHNOLOGY, INC., New Taipei (TW)

(72) Inventors: Ching-Ming Yang, New Taipei (TW); Cheng-Shu Peng, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 0 days.

(21) Appl. No.: 17/495,780

(22) Filed: Oct. 6, 2021

(51) Int. Cl.
*H05K 7/20* (2006.01)
*F28F 13/18* (2006.01)
*F28F 21/08* (2006.01)
*F28D 1/02* (2006.01)

(52) U.S. Cl.
CPC ....... *H05K 7/20509* (2013.01); *F28F 13/185* (2013.01); *F28F 21/085* (2013.01); *H05K 7/20481* (2013.01); *F28D 1/02* (2013.01); *F28D 2001/0286* (2013.01); *F28F 2245/02* (2013.01); *F28F 2245/04* (2013.01); *F28F 2245/06* (2013.01); *F28F 2255/18* (2013.01)

(58) Field of Classification Search
CPC ........... H05K 7/20509; H05K 7/20481; H05K 7/20472; H05K 7/20463; H05K 7/20454; H05K 7/20445; F28F 13/185; F28F 21/085
See application file for complete search history.

(56) References Cited

U.S. PATENT DOCUMENTS

2020/0413565 A1* 12/2020 Shiau .................... F28D 15/046

FOREIGN PATENT DOCUMENTS

| CN | 107231780 A | * | 10/2017 | |
| KR | 2018012999 A | * | 2/2018 | ............. C01B 32/21 |
| WO | WO-9218579 A1 | * | 10/1992 | .......... C10M 107/34 |

* cited by examiner

Primary Examiner — Devon Russell
(74) Attorney, Agent, or Firm — Li & Cai Intellectual Property Office

(57) ABSTRACT

An immersion heat dissipation structure is provided. The immersion heat dissipation structure includes a porous metal heat dissipation material, an integrated heat spreader, and a thermal interface material. The porous metal heat dissipation material has a porosity greater than 8%. The porous metal heat dissipation material and the integrated heat spreader have the thermal interface material arranged therebetween so that a thermal connection is formed therebetween. A super-wetting layer is formed on a connection surface between the porous metal heat dissipation material and the thermal interface material, and the super-wetting layer has a wetting angle of less than 10 degrees to water. Alternatively, a super-hydrophobic layer is formed on the connection surface between the porous metal heat dissipation material and the thermal interface material, and the super-hydrophobic layer has a wetting angle of greater than 120 degrees to water.

8 Claims, 2 Drawing Sheets

IMMERSION HEAT DISSIPATION STRUCTURE

FIELD OF THE DISCLOSURE

The present disclosure relates to a heat dissipation structure, and more particularly to an immersion heat dissipation structure.

BACKGROUND OF THE DISCLOSURE

An immersion cooling technology is performed by directly immersing heat-generating components (such as servers and disk arrays) in a cooling fluid that is non-electrically conductive, so that heat generated by operations of the heat-generating components can be removed by evaporation of the cooling fluid. However, how to dissipate heat more effectively through the immersion cooling technology is one of the issues that needs to be solved in the related field.

SUMMARY OF THE DISCLOSURE

In response to the above-referenced technical inadequacy, the present disclosure provides an immersion heat dissipation structure.

In one aspect, the present disclosure provides an immersion heat dissipation structure, which includes a porous metal heat dissipation material, an integrated heat spreader, and a thermal interface material. The porous metal heat dissipation material has a porosity greater than 8%. The porous metal heat dissipation material and the integrated heat spreader have the thermal interface material arranged therebetween so that a thermal connection is formed therebetween. A super-wetting layer is formed on a connection surface between the porous metal heat dissipation material and the thermal interface material. The super-wetting layer has a wetting angle of less than 10 degrees to water.

In certain embodiments, the porous metal heat dissipation material is a porous copper heat dissipation material formed by sintering copper powder.

In certain embodiments, the thermal interface material is a hydrophilic thermal grease.

In certain embodiments, the super-wetting layer is a film layer having a thickness less than 10 μm.

In another aspect, the present disclosure provides an immersion heat dissipation structure, which includes a porous metal heat dissipation material, an integrated heat spreader, and a thermal interface material. The porous metal heat dissipation material has a porosity greater than 8%. The porous metal heat dissipation material and the integrated heat spreader have the thermal interface material arranged therebetween so that a thermal connection is formed therebetween. A super-hydrophobic layer is formed on a connection surface between the porous metal heat dissipation material and the thermal interface material. The super-hydrophobic layer has a wetting angle of greater than 120 degrees to water.

In certain embodiments, the porous metal heat dissipation material is a porous copper heat dissipation material formed by sintering copper powder.

In certain embodiments, the thermal interface material is a non-hydrophilic thermal grease.

In certain embodiments, the super-hydrophobic layer is a film layer having a thickness less than 10 μm.

Therefore, one of the beneficial effects of the present disclosure is that, by virtue of "the porous metal heat dissipation material having the porosity greater than 8%", "the porous metal heat dissipation material and the integrated heat spreader having the thermal interface material arranged therebetween so that the thermal connection is formed therebetween", "the super-wetting layer being formed on the connection surface between the porous metal heat dissipation material and the thermal interface material, and the super-wetting layer having the wetting angle of less than 10 degrees to water", or "the super-hydrophobic layer being formed on the connection surface between the porous metal heat dissipation material and the thermal interface material, and the super-hydrophobic layer having the wetting angle of greater than 120 degrees to water", an air bubble generation in an area of the porous metal heat dissipation material of the immersion heat dissipation structure provided by the embodiments of the present disclosure can be effectively increased, and the connection property between the thermal interface material and the porous metal heat dissipation material can be increased through the super-wetting layer or the super-hydrophobic layer, thereby further improving thermal transmittance.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
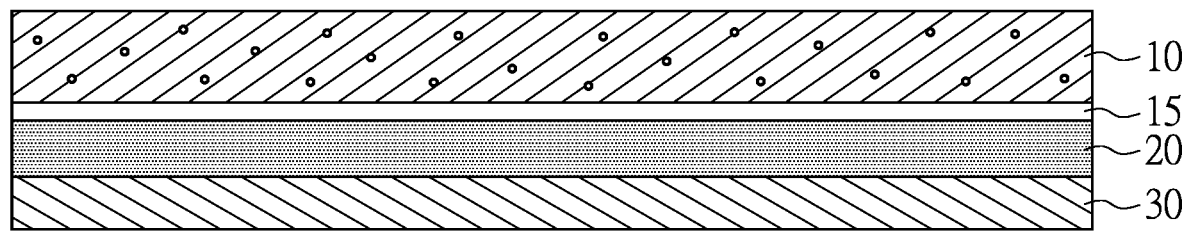
FIG. 1 is a schematic side view of an immersion heat dissipation structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which illustrates an immersion heat dissipation structure according to a first embodiment of the present disclosure. As shown in FIG. 1, the immersion heat dissipation structure provided by the first embodiment of the present disclosure includes, roughly from top to bottom, a porous metal heat dissipation material 10, a thermal interface material 20, and an integrated heat spreader 30.

In the present embodiment, the porous metal heat dissipation material 10 can be a porous copper heat dissipation material formed by sintering copper powder, and can be immersed in a two-phase coolant (such as an electronic fluorinated liquid), so that a number of air bubbles formed by evaporation of the two-phase coolant can be greatly increased, thereby greatly enhancing a heat dissipation effect. Moreover, the porous metal heat dissipation material 10 of the present embodiment has a porosity greater than 8%, such that the number of air bubbles formed by evaporation of the two-phase coolant can be greatly increased.

In the present embodiment, the integrated heat spreader 30 can be used to contact a heat-generating component, and the porous metal heat dissipation material 10 and the integrated heat spreader 30 have the thermal interface material 20 arranged therebetween, so that a thermal connection between the integrated heat spreader 30 and the porous metal heat dissipation material 10 is increased, thereby improving thermal transmittance from the integrated heat spreader 30 to porous metal heat dissipation material 10.

Figure 2:
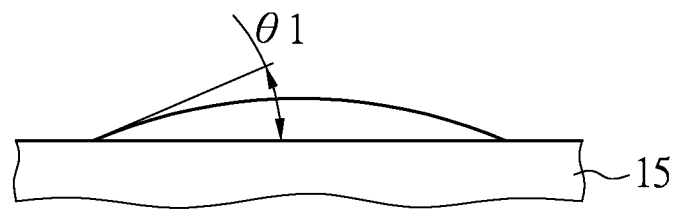
FIG. 2 is a schematic view illustrating a measurement of a wetting angle of a super-wetting layer according to the first embodiment of the present disclosure.

In the present embodiment, the thermal interface material 20 is a thermal grease, and is a hydrophilic thermal grease, such as a hydrophilic epoxy resin-based thermal grease. Accordingly, a super-wetting layer 15, of which wettability of a surface of a material thereof can be changed by adjusting the material that is used or by a microstructure of the surface of the material, is formed on a connection surface between the porous metal heat dissipation material 10 and the thermal interface material 20, such that the thermal connection between the integrated heat spreader 30 and the porous metal heat dissipation material 10 is increased. Moreover, the super-wetting layer 15 of the present embodiment has a wetting angle θ1 of less than 10 degrees to water (as shown in FIG. 2), such that a connection between the thermal interface material that is hydrophilic and the porous metal heat dissipation material 10 can be increased through the super-wetting layer 15 having an ultra-high wetting property, thereby further improving the thermal transmittance.

Furthermore, the super-wetting layer 15 is a film layer having a thickness of less than 10 μm, such that the connection between the thermal interface material 20 that is hydrophilic and the porous metal heat dissipation material 10 is further increased and the thermal transmittance is further improved through the super-wetting layer 15 having the ultra-high wetting property.

Second Embodiment

Figure 3:
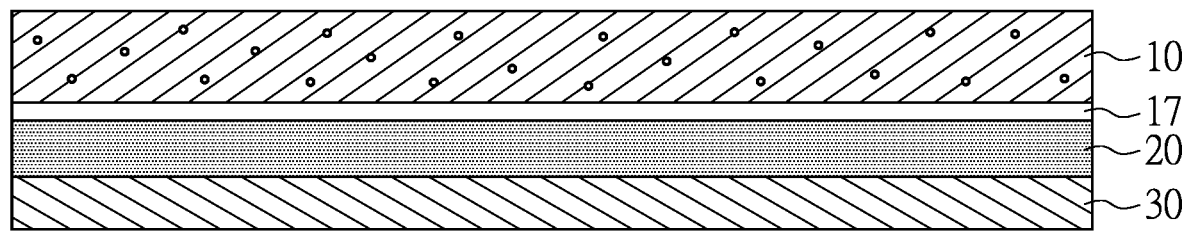
FIG. 3 is a schematic side view of an immersion heat dissipation structure according to a second embodiment of the present disclosure.

Reference is made to FIG. 3, which illustrates an immersion heat dissipation structure according to a second embodiment of the present disclosure. The immersion heat dissipation structure of the second embodiment is substantially the same as that of the first embodiment, and differences therebetween are described below.

Figure 4:
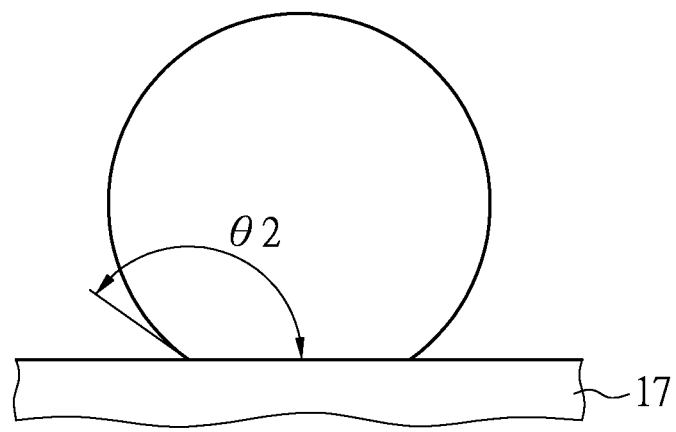
FIG. 4 is a schematic view illustrating a measurement of a wetting angle of a super-wetting layer according to the second embodiment of the present disclosure.

In the present embodiment, the thermal interface material 20 is a thermal grease, and is a non-hydrophilic thermal grease, such as a non-hydrophilic silicon oil-based thermal grease. Accordingly, a super-hydrophobic layer 17, of which hydrophobicity of a surface of a material can be changed by adjusting the material that is used or by a microstructure of the surface of the material, is formed on the connection surface between the porous metal heat dissipation material 10 and the thermal interface material 20, such that the thermal connection between the integrated heat spreader 30 and the porous metal heat dissipation material 10 is increased. Moreover, the super-hydrophobic layer 17 of the present embodiment has a wetting angle θ2 of greater than 120 degrees to water (as shown in FIG. 4), such that the connection between the thermal interface material 20 that is hydrophobic and the porous metal heat dissipation material 10 can be increased through the super-hydrophobic layer 17 having an ultra-high hydrophobic property, thereby further improving the thermal transmittance.

Furthermore, the super-hydrophobic layer 17 is a film layer having a thickness of less than 10 μm, such that the connection property between the thermal interface material 20 that is hydrophobic and the porous metal heat dissipation material 10 is further increased and the thermal transmittance is further improved through the super-hydrophobic layer 17 having the ultra-high hydrophobic property.

Beneficial Effects of the Embodiments

In conclusion, one of the beneficial effects of the present disclosure is that, by virtue of "the porous metal heat dissipation material 10 having the porosity greater than 8%", "the porous metal heat dissipation material 10 and the integrated heat spreader 30 having the thermal interface material 20 arranged therebetween so that the thermal connection is formed therebetween", "the super-wetting layer 15 being formed on the connection surface between the porous metal heat dissipation material 10 and the thermal interface material 20, and the super-wetting layer 15 having the wetting angle of less than 10 degrees to water", or "the super-hydrophobic layer 17 being formed on the connection surface between the porous metal heat dissipation material 10 and the thermal interface material 20, and the super-hydrophobic layer 17 having the wetting angle of greater than 120 degrees to water", an air bubble generation in an area of the porous metal heat dissipation material 10 of the immersion heat dissipation structure provided by the embodiments of the present disclosure can be effectively increased, and the connection property between the thermal interface material 20 and the porous metal heat dissipation material 10 can be increased through the super-wetting layer 15 or the super-hydrophobic layer 17, thereby further improving the thermal transmittance of the immersion heat dissipation structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An immersion heat dissipation structure, comprising:
   a porous metal heat dissipation material having a porosity greater than 8%;
   an integrated heat spreader; and
   a thermal interface material;
   wherein the porous metal heat dissipation material and the integrated heat spreader have the thermal interface material arranged therebetween so that a thermal connection is formed therebetween, a super-wetting layer is formed on a connection surface between the porous metal heat dissipation material and the thermal interface material, and the super-wetting layer has a wetting angle of less than 10 degrees to water.

2. The immersion heat dissipation structure according to claim 1, wherein the porous metal heat dissipation material is a porous copper heat dissipation material formed by sintering copper powder.

3. The immersion heat dissipation structure according to claim 1, wherein the thermal interface material is a hydrophilic thermal grease.

4. The immersion heat dissipation structure according to claim 1, wherein the super-wetting layer is a film layer having a thickness less than 10 μm.

5. An immersion heat dissipation structure, comprising:
   a porous metal heat dissipation material having a porosity greater than 8%;
   an integrated heat spreader; and
   a thermal interface material;
   wherein the porous metal heat dissipation material and the integrated heat spreader have the thermal interface material arranged therebetween so that a thermal connection is formed therebetween, a super-hydrophobic layer is formed on a connection surface between the porous metal heat dissipation material and the thermal interface material, and the super-hydrophobic layer has a wetting angle of greater than 120 degrees to water.

6. The immersion heat dissipation structure according to claim 5, wherein the porous metal heat dissipation material is a porous copper heat dissipation material formed by sintering copper powder.

7. The immersion heat dissipation structure according to claim 5, wherein the thermal interface material is a non-hydrophilic thermal grease.

8. The immersion heat dissipation structure according to claim 5, wherein the super-hydrophobic layer is a film layer having a thickness less than 10 μm.

* * * * *